(12) United States Patent
Mu et al.

(10) Patent No.: US 10,030,176 B2
(45) Date of Patent: Jul. 24, 2018

(54) ELECTRICALLY CONDUCTIVE ADHESIVES COMPRISING FLUOROELASTOMERS

(71) Applicant: E. I. DU PONT DE NEMOURS AND COMPANY, Wilmington (DE)

(72) Inventors: Minfang Mu, Shanghai (CN); Zengjun Liu, Shanghai (CN)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 143 days.

(21) Appl. No.: 14/759,926

(22) PCT Filed: Jan. 9, 2014

(86) PCT No.: PCT/US2014/010844
§ 371 (c)(1),
(2) Date: Jul. 8, 2015

(87) PCT Pub. No.: WO2014/110238
PCT Pub. Date: Jul. 17, 2014

(65) Prior Publication Data
US 2015/0353779 A1    Dec. 10, 2015

(30) Foreign Application Priority Data

Jan. 10, 2013 (CN) .......................... 2013 1 0009060

(51) Int. Cl.
| | | |
|---|---|---|
| C09J 9/02 | (2006.01) | |
| C09J 127/20 | (2006.01) | |
| H01L 31/0224 | (2006.01) | |
| H01B 1/22 | (2006.01) | |

(52) U.S. Cl.
CPC .............. *C09J 9/02* (2013.01); *C09J 127/20* (2013.01); *H01B 1/22* (2013.01); *H01L 31/022416* (2013.01); *H01L 31/022425* (2013.01); *Y02E 10/50* (2013.01)

(58) Field of Classification Search
USPC ..................................... 136/256; 156/244.11
See application file for complete search history.

(56) References Cited

U.S. PATENT DOCUMENTS

| | | | |
|---|---|---|---|
| 3,707,529 A | 12/1972 | Gladding et al. | |
| 4,560,498 A | 12/1985 | Horsma et al. | |
| 4,694,045 A | 9/1987 | Moore | |
| 5,395,876 A | 3/1995 | Frentzel et al. | |
| 5,552,199 A | 9/1996 | Blong et al. | |
| 5,717,036 A | 2/1998 | Saito et al. | |
| 5,759,291 A | 6/1998 | Ichinose et al. | |
| 5,932,339 A | 8/1999 | Sakurai et al. | |
| 8,163,835 B2 | 4/2012 | Park et al. | |
| 2004/0058240 A1 | 3/2004 | Christensen | |
| 2006/0118767 A1 | 6/2006 | Jang et al. | |
| 2009/0078747 A1 | 3/2009 | Park et al. | |
| 2009/0178834 A1 | 7/2009 | Akutsu et al. | |
| 2010/0028672 A1 | 2/2010 | Yoshioka et al. | |
| 2010/0147355 A1* | 6/2010 | Shimizu ............ H01L 31/02008 136/244 |
| 2010/0209599 A1* | 8/2010 | Van Veen .................. H01B 1/22 427/126.1 |
| 2012/0012153 A1* | 1/2012 | Azechi ...................... H01B 1/22 136/244 |
| 2012/0145315 A1 | 6/2012 | Knaapila et al. | |
| 2013/0075666 A1* | 3/2013 | Han ......................... H01B 1/124 252/501.1 |
| 2013/0139868 A1* | 6/2013 | Zhang ...................... C09K 11/06 136/247 |
| 2015/0041052 A1* | 2/2015 | Zhang ...................... C09B 57/00 156/244.11 |
| 2015/0357497 A1* | 12/2015 | Mu ............................ C09J 9/02 136/256 |

FOREIGN PATENT DOCUMENTS

| | | |
|---|---|---|
| CA | 2067891 A | 11/1992 |
| CN | 101605860 A | 12/2009 |
| CN | 101853711 A | 10/2010 |
| CN | 101861677 A | 10/2010 |
| CN | 101529603 A | 12/2010 |
| CN | 101107678 B | 3/2012 |
| CN | 102414831 A | 4/2012 |
| CN | 102277109 B | 1/2013 |
| CN | 102443365 B | 11/2013 |
| CN | 103436197 B | 11/2015 |
| DE | 3632651 A1 | 4/1987 |
| EP | 0351047 A2 | 1/1990 |
| EP | 0784064 A1 | 7/1997 |
| EP | 1274100 A2 | 1/2003 |
| EP | 1538637 A1 | 6/2005 |
| EP | 1650768 A1 | 4/2006 |
| EP | 2408014 A1 | 1/2012 |
| EP | 2490265 A1 | 8/2012 |
| GB | 2085339 A | 4/1982 |
| JP | 59227966 A | 12/1984 |
| JP | 02-005304 A | 1/1990 |
| JP | 03203949 A | 9/1991 |
| JP | 11-080682 A | 3/1999 |
| JP | 2001214149 A | 8/2001 |
| JP | 2003253239 A | 9/2003 |
| JP | 2005044524 A | 2/2005 |
| JP | 2005085724 A | 3/2005 |
| JP | 2007-015022 A | 1/2007 |
| JP | 3925571 B2 | 6/2007 |
| JP | 4152163 B2 | 9/2008 |
| JP | 04-245109 A | 3/2009 |

(Continued)

OTHER PUBLICATIONS

International Search Report dated Apr. 23, 2014 for International Patent Application No. PCT/US2014/010844.

(Continued)

Primary Examiner — Mark Kaucher
Assistant Examiner — Henry Hu

(57) ABSTRACT

Disclosed herein is an electrically conductive adhesive composition and its use in solar cell modules, wherein the electrically conductive adhesive comprises a fluoroelastomer matrix and dispersed in the fluoroelastomer matrix about 40-90 wt % of conductive particles, with the wt % of all components comprised in the compositions totaling to 100 wt %.

18 Claims, No Drawings

(56) References Cited

FOREIGN PATENT DOCUMENTS

| JP | 2010037493 A | 2/2010 |
|---|---|---|
| JP | 2010108845 A | 5/2010 |
| JP | 2010-257958 A | 11/2010 |
| KR | 2007065800 A | 6/2007 |
| KR | 2009053425 A | 5/2009 |
| KR | 2011048100 A | 5/2011 |
| WO | 02/38669 A1 | 5/2002 |
| WO | 2010/0103998 A1 | 9/2010 |
| WO | 2012/102080 A1 | 8/2012 |

OTHER PUBLICATIONS

Anil K. Bhowmick et al., Handbook of Elastomers (Second Edition), Jan. 31, 2005, Version 1, Petrochemical Press, pp. 407-408.
Kang et al., Development of High Conductivity Lead (Pb)-Free Conducting Adhesives, IEEE Transactions on Components, Packaging, and Manufacturing Technology—Part A. vol. 21, No. 1, Mar. 1988, pp. 18-22.
Scherff et al., 10×10 cm2 HIT Solar Cells Contacted with Lead-Free Electrical Conductive Adhesives to Solar Cell Interconnectors, Photovoltaic Energy Conversion, Conference Record of the 2006 IEEE 4th World Conference on, vol. 2, Digital Object Identifier: 10.1109/WCPEC.2006.279709, Publication Year: 2006, pp. 1384-1387.

\* cited by examiner

ELECTRICALLY CONDUCTIVE ADHESIVES COMPRISING FLUOROELASTOMERS

TECHNICAL FIELD

The disclosure is related to fluoroelastomer-based electrically conductive adhesives.

BACKGROUND

In solar cell modules, the solar cells have surface electrodes, to which the wiring members (also called electro-conductive interconnect members or ribbons) are connected for extracting power from the cells. The wiring members are usually in the form of metal strips (such as Cu strips) and they are often connected to the surface electrodes by soldering. However, since relatively high temperatures are necessary for such soldering, stresses are applied to the connect structure due to the difference in co-efficiency of thermal shrinkage among the semiconductor structure responsible for power generation, the surface electrodes, the solder, and the wiring members. Such thermal stresses can cause the solar cell to be warped and cracked.

To solve this problem, people have proposed the use of polymer-based electrically conductive adhesives in place of solder to connect the wiring members with the surface electrodes of the solar cells. Such polymer-based electrically conductive adhesives typically are comprised of insulating polymers (such as, epoxy, acrylic, phenoxy, polyimide, or silicone) and electro-conductive particles (such as Ag particles) (see, for example, U.S. Patent Publication Nos. 2010/0147355 and 2012/0012153). And among them, silicone-based electrically conductive adhesives are more preferred than epoxy-based electrically conductive adhesives due its low modulus. However, it is found that, silicone rubber has a much higher coefficient of thermal expansion (CTE) than the electro-conductive particles, which can lead to a decrease in power output of the solar modules upon thermal cycling. Thus, there is still a need to develop novel polymer-based electrically conductive adhesives that could maintain its efficiency after thermal cycling.

SUMMARY

The purpose of the present disclosure is to provide a solar cell module comprising at least one solar cell and at least one wiring member, wherein, the at least one solar cell has at least one surface electrode and the at least one wiring member is connected to the at least one surface electrode via an electrically conductive adhesive; the electrically conductive adhesive is formed of an adhesive composition comprising an elastomer matrix and 40-90 wt % of conductive particles dispersed in the elastomer matrix, with the wt % of all components comprised in the adhesive composition totaling to 100 wt %; and the elastomer matrix comprises at least one fluoroelastomer.

In one embodiment of the solar cell module, the elastomer matrix comprises at least one vinylidene fluoride-containing fluoroelastomer that is cross-linked with a cross-linking agent. In such embodiments, the cross-linking agent may be selected from the group consisting of bisphenol compounds, diamino compounds, aminophenol compounds, amino-siloxane compounds, amino-silanes, phenol-silanes, peroxides, and combinations of two or more thereof. Or, the at least one vinylidene fluoride-containing fluoroelastomer may be vinylidene fluoride/hexafluoropropylene copolymer.

In a further embodiment of the solar cell module, the elastomer matrix consists essentially of the at least one fluoroelastomer.

In a yet further embodiment of the solar cell module, the elastomer matrix comprises the at least one fluoroelastomer and at least one ethylene/alkyl (meth)acrylate copolymer elastomer, with the at least one fluoroelastomer present at a level of 65 wt % or more, based on the total weight of the elastomer matrix. In such embodiment, the at least one ethylene/alkyl (meth)acrylate copolymer elastomer may comprise polymerized units of ethylene and 40-90 wt %, or preferably 50-80 wt %, or more preferably 50-75 wt % of polymerized units of at least one alkyl (meth)acrylate, based on the total weight of the ethylene/alkyl (meth)acrylate copolymer elastomer. Or, the at least one ethylene/alkyl (meth)acrylate copolymer elastomer may be selected form the group consisting of ethylene/methyl acrylate copolymers, ethylene/ethyl acrylate copolymers, ethylene/butyl acrylate copolymers.

In a yet further embodiment of the solar cell module, the conductive particles may be selected from metal particles and non-metal particles. Or, the conductive particles may be metal particles, or preferably, the conductive particles are selected from the group consisting of particles of Au, Ag, Ni, Cu, Al, Sn, Zn, Ti, Sn, Bi, W, Pb, and alloys of two or more thereof, or more preferably the conductive particles are selected from particles of Cu, Ag, Ni, and alloys thereof, or yet more preferably, the conductive particles are Ag particles.

In a yet further embodiment of the solar cell module, 40-85 wt %, or 45-83 wt %, of the conductive particles are dispersed in the elastomer matrix, based on the total weight of the adhesive composition.

In a yet further embodiment of the solar cell module, the at least one solar cell has a front surface electrode and a back surface electrode, and wherein there are one or more front wiring members connected to the front surface electrode via the electrically conductive adhesive and one or more back wiring members connected to the back surface electrode via the electrically conductive adhesive. In such embodiments, the at least one solar cell may be a wafer-based solar cell. Or, the at least one solar cell may be a thin film solar cell.

In accordance with the present disclosure, when a range is given with two particular end points, it is understood that the range includes any value that is within the two particular end points and any value that is equal to or about equal to any of the two end points.

DETAILED DESCRIPTION

Disclosed herein are electrically conductive adhesive compositions that comprise an elastomer matrix and about 40-90 wt % of conductive particles dispersed in the elastomer matrix, with the wt % of all components comprised in the composition totaling to 100 wt %. The elastomer matrix comprises or consists essentially of at least one fluoroelastomer.

By "fluoroelastomer" is meant an amorphous elastomeric fluoropolymer. The fluoropolymer used herein contains at least about 53 wt % of fluorine, or at least about 64 wt % of fluorine, based on the total weight of the fluoroelastomer.

In accordance to the present disclosure, the fluoroelastomer matrix comprises at least one vinylidene fluoride-containing fluoroelastomer.

The vinylidene fluoride-containing fluoroelastomers used herein may contain about 25-70 wt % of copolymerized units of vinylidene fluoride ($VF_2$), based on the total weight of the fluoroelastomer. In such embodiments, the remaining units of the fluoroelastomers are comprised of one or more additional copolymerized monomers that are different from vinylidene fluoride. Such one or more additional polymerized monomers that are different from vinylidene fluoride may be selected from fluorine-containing olefins, fluorine-containing vinyl ethers, hydrocarbon olefins, and mixtures thereof.

Fluorine-containing olefins copolymerizable with the vinylidene fluoride include, but are not limited to, hexafluoropropylene (HFP), tetrafluoroethylene (TFE), 1,2,3,3,3-pentafluoropropene (1-HPFP), chlorotrifluoroethylene (CTFE), and vinyl fluoride.

Fluorine-containing vinyl ethers copolymerizable with vinylidene include, but are not limited to, perfluoro(alkyl vinyl) ethers (PAVE). PAVE suitable for use as monomers include those of the formula $$CF_2=CFO(R_fO)_n(R_{f'}O)_mR_{f''} \quad (I)$$

where $R_f$ and $R_{f'}$ are different linear or branched perfluoroalkylene groups of 2-6 carbon atoms; m and n are independently integers of 0-10; and $R_{f''}$ is a perfluoroalkyl group of 1-6 carbon atoms.

A preferred class of perfluoro(alkyl vinyl) ethers includes thoses of the formula:

$$CF_2=CFO(CF_2CFXO)_nR_f \quad (II)$$

where X is F or CF3; n is an integer of 0-5; and $R_f$ is a perfluoroalkyl group of 1-6 carbon atoms.

A most preferred class of perfluoro(alkyl vinyl) ethers includes those ethers wherein n is 0 or 1 and $R_f$ contains 1-3 carbon atoms. Examples of such perfluorinated ethers include perfluoro(methyl vinyl) ether (PMVE) and perfluoro(propyl vinyl) ether (PPVE). Other useful monomers include compounds of the formula $$CF_2=CFO[(CF_2)_mCF_2CFZO]_nR_f \quad (III)$$

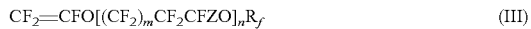

where $R_f$ is a perfluoroalkyl group having 1-6 carbon atoms, m is 0 or 1; n is an integer of 0-5; and Z is F or $CF_3$. Preferred members of this class are those in which $R_f$ is $C_3F_7$; m is 0; and n is 1.

Additional perfluoro(alkyl vinyl) ether monomers include those of the formula $$CF_2=CFO[(CF_2CF\{CF_3\}O)_n(CF_2CF_2CF_2O)_m(CF_2)_p]C_xF_{2x+i} \quad (IV)$$

where m and n are independently integers of 0-10; p is an integer of 0-3; and x is an integer of 1-5.

Preferred members of this class include compounds where n is 0 or 1; m is 0 or 1; and x is 1.

Other examples of useful perfluoro(alkyl vinyl ethers) include $$CF_2=CFOCF_2CF(CF_3)O(CF_2O)_mC_nF_{2n+i} \quad (V)$$

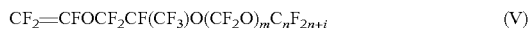

where n is an integer of 1-5; m is an integer of 1-3; and where, preferably, n is 1.

If copolymerized units of PAVE are present in the fluoroelastomers used herein, the PAVE content generally ranges from about 25 wt % to about 75 wt %, based on the total weight of the fluoroelastomer. If PMVE is used, then the fluoroelastomer used herein preferably contains between about 30 wt % and about 55 wt % copolymerized PMVE units.

The fluoroelastomers used herein may also, optionally, comprise units of one or more cure site monomers. Examples of suitable cure site monomers include, without limitation, i) bromine-containing olefins; ii) iodine-containing olefins; iii) bromine-containing vinyl ethers; iv) iodine-containing vinyl ethers; v) 1,1,3,3,3-pentafluoropropene (2-HPFP); and vi) non-conjugated dienes.

Brominated cure site monomers may contain other halogens, preferably fluorine. Examples of brominated olefin cure site monomers are $CF_2=CFOCF_2CF_2CF_2OCF_2CF_2Br$; bromotrifluoroethylene; 4-bromo-3,3,4,4-tetrafluorobutene-1 (BTFB); and others such as vinyl bromide, 1-bromo-2,2-difluoroethylene; perfluoroallyl bromide; 4-bromo-1,1,2-trifluorobutene-1; 4-bromo-1,1,3,3,4,4-hexafluorobutene; 4-bromo-3-chloro-1,1,3,4,4-pentafluorobutene; 6-bromo-5,5,6,6-tetrafluorohexene; 4-bromoperfluorobutene-1; and 3,3-difluoroallyl bromide. Brominated vinyl ether cure site monomers useful herein include 2-bromo-perfluoroethyl perfluorovinyl ether and fluorinated compounds of the class $CF_2Br—R_f—O—CF=CF_2$ ($R_f$ is a perfluoroalkylene group), such as $CF_2BrCF_2O—CF=CF_2$, and fluorovinyl ethers of the class $ROCF=CFBr$ or $ROCBr=CF_2$ (where R is a lower alkyl group or fluoroalkyl group) such as $CH_3OCF=CFBr$ or $CF_3CH_2OCF=CFBr$.

Suitable iodinated cure site monomers include iodinated olefins of the formula: $CHR=CH—Z—CH_2CHR—I$, wherein R is —H or —$CH_3$; Z is a $C_1$-$C_{18}$ (per)fluoroalkylene radical, linear or branched, optionally containing one or more ether oxygen atoms, or a (per)fluoropolyoxyalkylene radical as disclosed in U.S. Pat. No. 5,674,959. Other examples of useful iodinated cure site monomers are unsaturated ethers of the formula: $I(CH_2CF_2CF_2)_nOCF=CF_2$ and $ICH_2CF_2O[CF(CF_3)CF_2O]_nCF=CF_2$, and the like, wherein n is an integer of 1-3, such as disclosed in U.S. Pat. No. 5,717,036. In addition, suitable iodinated cure site monomers including iodoethylene, 4-iodo-3,3,4,4-tetrafluorobutene-1 (ITFB); 3-chloro-4-iodo-3,4,4-trifluorobutene; 2-iodo-1,1,2,2-tetrafluoro-1-(vinyloxy)ethane; 2-iodo-1-(perfluorovinyloxy)-1,1,-2,2-tetrafluoroethylene; 1,1,2,3,3,3-hexafluoro-2-iodo-1-(perfluorovinyloxy)propane; 2-iodoethyl vinyl ether; 3,3,4,5,5,5-hexafluoro-4-iodopentene; and iodotrifluoroethylene are disclosed in U.S. Pat. No. 4,694,045. Allyl iodide and 2-iodo-perfluoroethyl perfluorovinyl ether are also useful cure site monomers.

Examples of non-conjugated diene cure site monomers include, but are not limited to 1,4-pentadiene; 1,5-hexadiene; 1,7-octadiene; 3,3,4,4-tetrafluoro-1,5-hexadiene; and others, such as those disclosed in Canadian Patent 2,067,891 and European Patent 0784064A1. A suitable triene is 8-methyl-4-ethylidene-1,7-octadiene. Of the cure site monomers listed above, preferred compounds, for situations wherein the fluoroelastomer will be cured with peroxide, include 4-bromo-3,3,4,4-tetrafluorobutene-1 (BTFB); 4-iodo-3,3,4,4-tetrafluorobutene-1 (ITFB); allyl iodide; and bromotrifluoroethylene. When the fluoroelastomer will be cured with a polyol, 2-HPFP is the preferred cure site monomer. However, a cure site monomer is not required in copolymers of vinylidene fluoride and hexafluoropropylene in order to cure with a polyol.

Units of cure site monomer, when present in the fluoroelastomers used herein, are typically present at a level of about 0.05-10 wt %, or about 0.05-5 wt %, or about 0.05-3 wt %, based on the total weight of fluoroelastomer.

Additionally, iodine-containing end groups, bromine-containing end groups or mixtures thereof may optionally be present at one or both of the fluoroelastomer polymer chain ends as a result of the use of chain transfer or molecular weight regulating agents during preparation of the fluoroelastomers. The amount of chain transfer agent, when employed, is calculated to result in an iodine or bromine level in the fluoroelastomer in the range of about 0.005-5 wt %, or about 0.05-3 wt %.

Examples of chain transfer agents include iodine-containing compounds that result in incorporation of bound iodine at one or both ends of the polymer molecules. Methylene iodide; 1,4-diiodoperfluoro-n-butane; and 1,6-diiodo-3,3,4,4,tetrafluorohexane are representative of such agents. Other iodinated chain transfer agents include 1,3-diiodoperfluoropropane; 1,6-diiodoperfluorohexane; 1,3-diiodo-2-chloroperfluoropropane; 1,2-di(iododifluoromethyl)-perfluorocyclobutane; monoiodoperfluoroethane; monoiodoperfluorobutane; 2-iodo-1-hydroperfluoroethane, etc. Also included are the cyano-iodine chain transfer agents disclosed in European Patent 0868447A1. Particularly preferred are diiodinated chain transfer agents. Examples of brominated chain transfer agents include 1-bromo-2-iodoperfluoroethane; 1-bromo-3-iodoperfluoropropane; 1-iodo-2-bromo-1,1-difluoroethane and others such as disclosed in U.S. Pat. No. 5,151,492.

Other chain transfer agents suitable for use in the fluoroelastomers used herein include those disclosed in U.S. Pat. No. 3,707,529. Examples of such agents include isopropanol, diethylmalonate, ethyl acetate, carbon tetrachloride, acetone, and dodecyl mercaptan.

Specific fluoroelastomers which may be used herein include, but are not limited to those having at least about 53 wt % fluorine and comprising copolymerized units of i) vinylidene fluoride and hexafluoropropylene; ii) vinylidene fluoride, hexafluoropropylene, and tetrafluoroethylene; iii) vinylidene fluoride, hexafluoropropylene, tetrafluoroethylene, and 4-bromo-3,3,4,4-tetrafluorobutene-1; iv) vinylidene fluoride, hexafluoropropylene, tetrafluoroethylene, and 4-iodo-3,3,4,4-tetrafluorobutene-1; v) vinylidene fluoride, perfluoro(methyl vinyl) ether, tetrafluoroethylene, and 4-bromo-3,3,4,4-tetrafluorobutene-1; vi) vinylidene fluoride, peril uoro(methyl vinyl) ether, tetrafluoroethylene, and 4-iodo-3,3,4,4-tetrafluorobutene-1; or vii) vinylidene fluoride, peril uoro(methyl vinyl) ether, tetrafluoroethylene, and 1,1,3,3,3-pentafluoropropene.

The fluoroelastomers used herein are typically prepared in an emulsion polymerization process, which may be a continuous, semi-batch, or batch process.

The fluoroelastomers useful herein are also commercially available from various vendors. For example, suitable fluoroelastomers may be obtained from E.I. du Pont de Nemours and Company (U.S.A.) (hereafter "DuPont") under the trade name Viton®, or from 3M (U.S.A.) (美国3M公司) under the trade name 3M™ Dyneon™, or from Daikin Industries, Ltd. (Japan) under the trade name DAI-EL™, or from Tetralene Elastomer, Inc. (U.S.A.) under the trade name FluoTrex™.

Preferably, the elastomer matrix used herein comprises or is formed of one or more vinylidene fluoride-containing fluoroelastomers that are cross-linked with a cross-linking agent. For example, the cross-linking agents used herein include, without limitation, bisphenol compounds, diamino compounds, aminophenol compounds, amino-siloxane compounds, amino-silanes, phenol-silanes, and peroxides. Exemplary diamine-based cross-linking agents include, N,N'-dicinnamal-1,6-hexamethylenediamine; hexamethylene diamine carbomate; N,N-Bis(salicylidene)-1,3-propanediamine; etc. Exemplary bisphenol-based cross-linking agents include, 2,2-bis(4-hydroxyphenyl) hexafluoropane; 4',4-(Hexafluoroisopropylidene) diphenol; benzyltriphenylphosphonium chloride; 2,4-dihydroxybenzophenone; bisphenol AF; etc. Exemplary peroxide-based cross-linking agents include, tert-butylcumyl peroxide; alpha,alpha-bis (tert-butylperoxy-isopropyl)benzene; 2,5-dimethyl-2,5-di(t-butyl-peroxy)hexane; etc. Suitable cross-linking agents also are available commercially from various vendors, which include, without limitation, those available from 3M under the trade name of 3M™ Dynamar™ Rubber Curative RC, or from R.T. Vanderbilt Company, Inc. (U.S.A.), under the trade name VAROX™, or from AkzoNobel Corporate (The Netherlands) under the trade names Trigonox™ or Perkadox™, or DuPont under the trade names VITON® CURATIVE 20, CURATIVE 30, or CURATIVE 50.

In one embodiment, the elastomer matrix comprises or consists essentially of the fluoroelastomer disclosed herein.

In a further embodiment, the elastomer matrix comprises the fluoroelastomer disclosed herein and at least one ethylene/alkyl (meth)acrylate copolymer elastomer. In such embodiments, it is preferred that the at least one fluoroelastomer is present at a level of about 65 wt % or more, based on the total weight of the elastomer matrix.

Ethylene/alkyl (meth)acrylate copolymer elastomers, also known as AEM rubbers, are derived from copolymerization of polymerized units of ethylene and about 45-90 wt %, or about 50-80 wt %, or about 50-75 wt % of polymerized units of at least one alkyl (meth)acrylate, based on the total weight of the ethylene/alkyl (meth)acrylate copolymer elastomer. The term "(meth)acrylate" is used herein to refer to esters of methacrylic acids and/or esters of acrylic acids, and the term "meth" is used herein to refer to —H or branched or non-branched groups $C_1$-$C_{10}$ alkyl, and the term "alkyl" is used herein to refer to —H or branched or non-branched groups of $C_1$-$C_{12}$ alkyl, $C_1$-$C_{20}$ alkoxyalkyl, $C_1$-$C_{12}$ cyanoalkyl, or $C_1$-$C_{12}$ fluoroalkyl. The alkyl (meth)acrylate groups used herein include, without limitation, alkyl acrylate, alkyl methacrylates, alkyl ethacrylates, alkyl propacrylates, and alkyl hexacrylates, alkoxyalkyl methacrylates, alkoxyalkyl ethacryates, alkoxyalkyl propacrylates and alkoxyalkyl hexacrylates. The alkyl groups may be substituted with cyano groups or one or more fluorine atoms. That is, the alkyl group may be a $C_1$-$C_{12}$ cyanoalkyl group or a $C_1$-$C_{12}$ fluoroalkyl group. The ethylene/alkyl (meth)acrylate copolymers may also comprise copolymerized units of more than one species of the alkyl (meth)acrylates, for example two different alkyl acrylate monomers. For example, the ethylene/alkyl (meth)acrylate copolymers used herein include, without limitation, ethylene/methyl acrylate copolymers (EMA), ethylene/ethyl acrylate copolymers (EEA), and ethylene/butyl acrylate copolymers (EBA).

Moreover, the ethylene/alkyl (meth)acrylate copolymer elastomers used herein may optionally further comprise up to about 5 wt % of a functionalized comonomer, based on the total weight of the ethylene/alkyl (meth)acrylate copolymer elastomer. The optional functionalized comonomers used herein, include, without limitation, (meth)acrylate glycidyl esters (such as glycidyl methacrylate), chlorovinyl ether, maleic acids, and other comonomers having one or more reactive groups including acid, hydroxyl, anhydride, epoxy, isocyanates, amine, oxazoline, chloroacetate, carboxylic ester moieties, or diene functionality. Also conceivable is that the ethylene/alkyl (meth)acrylate copolymer elastomers used herein are made by copolymerizing ethylene and more than one (e.g., two) alkyl (meth)acrylate monomers. Examples are ethylene/alkyl (meth)acrylate copolymer elastomers made by polymerizing ethylene, methyl acrylate, and a second acrylate (such as butyl acrylate).

It is also conceivable that the ethylene/alkyl (meth)acrylate copolymer elastomers used herein also may be blends of two or more ethylene/alkyl (meth)acrylate copolymer elastomers.

The ethylene/alkyl (meth)acrylate copolymer elastomers may be prepared by various processes well known in the polymer art. For example, the copolymerization can be run as a continuous process in an autoclave reactor. Or alternatively, the ethylene/alkyl (meth)acrylate copolymers used herein may be produced at high pressure and elevated temperature in a tubular reactor or the like. The copolymer can be separated from the product mixture with the unreacted monomers and solvent (if used) by conventional means, e.g., vaporizing the non-polymerized materials and solvent under reduced pressure and at an elevated temperature.

The ethylene/alkyl (meth)acrylate copolymer elastomers used herein are also available commercially. Exemplary ethylene/alkyl (meth)acrylate copolymer elastomers may include those available from DuPont under the trade name Vamac®.

Based on the total weight of the electrically conductive adhesive composition, the elastomer matrix may be present at a level of about 10-60 wt %, or about 15-60 wt %, or about 17-55 wt %.

The conductive particles used herein provide electrical conductivity in the adhesive composition upon circuit connection. The conductive particles may include metal particles, non-metal particles, metal coated particles, and combinations thereof. Suitable metal particles include, without limitation, particles of Au, Ag, Ni, Cu, Al, Sn, Zn, Ti, Sn, Bi, W, Pb, and alloys of two or more thereof. Suitable non-metal particles include, without limitation, carbon nanotube, graphene, polyaniline, polyacetylene, and polypyrrole, and combinations of two or more thereof. The metal coating material used in the metal coated particles may include, without limitation, Au, Ag, Ni, and combinations of two or more thereof. Suitable metal coated particles include, without limitation, Ag-coated glass beads, Ag-coated polystyrene particles, Ag-coated Cu particles, Ni-coated Cu particles, and combinations of two or more thereof. The size of the conductive particles may be determined depending on the pitch of circuits and may be, e.g., about 0.1 to about 50 µm, depending on the intended application.

Based on the total weight of the electrically conductive adhesive composition, the conductive particles may be present at a level of about 40-90 wt %, or about 40-85 wt %, or about 45-83 wt %.

In one embodiment of the electrically conductive adhesive composition disclosed herein, the fluoroelastomer matrix is formed of a vinylidene fluoride-containing fluoroelastomer (e.g., vinylidene fluoride/hexafluoropropylene copolymer) and the conductive particles are selected from particles of Cu, Ag, Ni, and alloys thereof. In a further embodiment of the electrically conductive adhesive composition disclosed herein, the fluoroelastomer matrix is formed of a vinylidene fluoride-containing fluoroelastomer (e.g., vinylidene fluoride/hexafluoropropylene copolymer) and the conductive particles are selected from Ag particles.

Further disclosed herein are electrically conductive sheets or tapes formed of the electrically conductive adhesive compositions disclosed hereabove.

Yet further disclosed herein are solar cell modules that comprise one or more solar cells and the electrically conductive adhesives. In such embodiments, the electrically conductive adhesives are included to electrically connect the surface electrodes of the solar cells with the wiring members (also called ribbons). And the wiring members are included to electrically connect the solar cells in series and/or in parallel and to form conductive paths for extracting the electric power out from the modules.

The solar cells used herein may be any article or material that can convert light into electrical energy. For example, the solar cells used herein include, without limitation, wafer-based solar cells (e.g., c-Si or mc-Si based solar cells) and thin film solar cells (e.g., a-Si, µc-Si, CdTe, copper indium selenide (CIS), copper-indium-gallium selenide (CIGS), light absorbing dyes, or organic semiconductor based solar cells).

The surface electrodes of the solar cells may be made of any suitable materials that can provide electrical conduction. For example, the surface electrodes may be formed by printing (e.g., screen printing or ink-jet printing) conductive paste over the solar cell surfaces. Specific examples of the suitable paste materials include, without limitation, silver paste, glass paste containing silver, gold paste, carbon past, nickel paste, aluminum paste, transparent conducting oxide (TCO) (such as indium tin oxide (ITO) or aluminum zinc oxide (AZO).

The wiring members, however, may be formed of any high conductive materials, such as copper, silver, aluminum, gold, nickel, cadmium, and alloys thereof.

The surface electrodes of the solar cells may be in any suitable patterns and the connection between the surface electrodes and the wiring member may be in any suitable forms.

For example, in a wafer-based solar cell module, each solar cell may comprise a front surface electrode and a back surface electrode, wherein the front surface electrode may be comprised of a plurality of parallel conductive fingers and two or more conductive bus bars perpendicular to and connecting the conductive fingers, and wherein the back surface electrode may be comprised of a layer of conductive paste and two or more conductive bus bars. In certain embodiments, the conductive fingers and the conductive bus bars are formed of silver paste and the layer of conductive paste comprised in the back surface electrode may be formed of aluminum paste. In such embodiments, the wiring members are connected to the front and back surface electrodes by adhering to the bus bars of the front and back electrodes via the electrically conductive adhesives disclosed herein.

In further embodiments, the front and/or back surface electrodes comprised in the solar cells may be free of bus bars. That is to say, for example, each of the solar cells comprises a front surface electrode that is formed of the plurality of conductive fingers only without bus bars and a back surface electrode that is formed of a layer of conductive paste and two or more conductive bus bars. In such embodiments, the wiring members are connected to the front surface electrode by adhering to the conductive fingers via the electrically conductive adhesives and to the back surface electrode by adhering to the bus bars via the electrically conductive adhesives. Or, each of the solar cells comprises a front surface electrode that is formed of the plurality of conductive finger and two or more bus bars and a back surface electrode that is formed of the conductive paste only without the bus bars. In such embodiments, the wiring members are connected to the front surface electrode by adhering to the bus bars via the electrically conductive adhesives and to the back surface electrode by adhering to the conductive paste via the electrically conductive adhesives. Or, each of the solar cells comprises a front surface electrode that is formed of the plurality of conductive fingers only without bus bars and a back surface electrode that is formed of the conductive paste only without the bus bars. In such embodiments, the wiring members are connected to the front surface electrode by adhering to the conductive fingers via the electrically adhesives and to the back surface electrode by adhering to the conductive paste via the electrically conductive adhesives.

In the form of thin film solar cell modules, the opposite surface electrodes are typically formed of transparent TCO layers or metal grids. In certain embodiments, the back surface electrodes may also be formed of metal films, (such as Al, TiN, Zn, Mo, stainless steel). In such embodiments, the wiring members may be connected to the electrodes by adhering to the electrodes via the electrically conductive adhesives. In certain embodiments, however, bus bars may be used and connected to each of the electrodes and the wiring members may be connected to the electrodes by adhering to the bus bars via the electrically conductive adhesives.

Any suitable process may be used when adhering the wiring member(s) to the surface electrode(s) via the fluoroelastomer-based electrically conductive adhesives. In one embodiment, the process may include: mixing and dissolving the fluoroelastomer-based elastomer materials, the conductive particles, the optional cross-linking agents, and other additives in a solvent (such as methyl isobutyl ketone or methyl ethyl ketone); casting the solution over one or both sides of the wiring member(s) followed by drying; and laminating the coated wiring members over the surface electrode(s) of the solar cells. Or, the process may include: mixing and dissolving the fluoroelastomer-based elastomer materials, the conductive particles, the optional cross-linking agents, and other additives in a solvent (such as methyl isobutyl ketone or methyl ethyl ketone); casting the solution over the surface electrode(s) of the solar cells followed by drying; and laminating the wiring members over the coated surface of the surface electrode(s). In a further embodiment, the process may include first preparing a pre-formed film or sheet of the fluoroelastomer-based electrically conductive composition and then laminating the wiring member(s) over the surface electrode(s) with the pre-formed electrically conductive film or sheet inbetween. And, the pre-formed electrically conductive film or sheet may be prepared by any suitable methods, such as casting (over a release film), extrusion, calendering, etc.

As demonstrated by the examples below, it is found that, compared to the conventional silicone-based electrically conductive adhesives, fluoroelastomer-based electrically conductive adhesives exhibit very much improved resistance to thermal cycling.

The following Examples and Comparative Examples are provided in order to set forth particular details of one or more embodiments. However, it will be understood that the embodiments are not limited to the particular details described.

EXAMPLES

Material:
Silicone: silicone sealant obtained from Beijing TONSAN Adhesive Co., Ltd (China) under the trade name Tonsan 1521;
Ag: Silver flakes with particle size of 2-4 μm obtained from Kunming Noble Metal Electronic Materials Co., Ltd. (China);
Fluoroelastomer-1 (FE-1): a fluoroelastomer composition comprising >99 wt % of vinylidene fluoride/hexafluoropropylene copolymer and <1 wt % barium sulfate, which had a nominal viscosity of 20 (as measured at 121° C.) and obtained from DuPont under the trade name Viton® A200;
Fluoroelastomer-2 (FE-2): a fluoroelastomer composition comprising >99 wt % vinylidene fluoride/hexafluoropropylene copolymer and <1 wt % barium sulfate, which had a nominal viscosity of 50 (as measured at 121° C.) and obtained from DuPont under the trade name Viton® A500;
Fluoroelastomer-3 (FE-3): a vinylidene fluoride/hexafluoropropylene composition comprising >95% of vinylidene fluoride/hexafluoropropylene copolymer, <1 wt % of benzyltriphenylphosphonium 4,4'-<Trifluoro-1-(Trifluoromethyl)Ethylidene>Diphenol Salt (1:1); <2 wt % of 4,4'-[2,2,2-Trifluoro-1-(trifluoromethyl)ethylidene]diphenol; and <1 wt % of barium sulfate, which was obtained from DuPont under the trade name Viton® VTR;
Fluoroelastomer-4 (FE-4): a fluoroelastomer comprising >98% of vinylidenefluoride/hexafluoropropylene/tetrafluoroethylene terpolymer and <1 wt % of barium sulfate, which was obtained from DuPont under the trade name Viton® GF 200S;
E/MA: an ethylene/methyl acrylate copolymer comprising 62 wt % methyl acrylate and having a Mooney viscosity (ML1+4, 100° C.) of 22;
Peroxide: 1,1-di(t-butylperoxy)-3,3,5-trimethylcyclohexane obtained from Sinopharm Chemical Reagent Co., Ltd (China);
TAIC: Triallyl isocyanurate obtained from DuPont under the trade name of Diak™-7;
Antioxidant-1: 4,4'-Bis(alpha, alpha-dimethylbenzyl)diphenylamine obtained from Chemtura Corporation (U.S.A.) under the trade name of Naugard® 445;
Antioxidant-2: Butylated hydroxytoluene obtained from Sinopharm Chemical Reagent Co., Ltd;
ZnO: ZnO obtained from Sinopharm Chemical Reagent Co., Ltd;
VC-30: Viton® Curative 30 obtained from DuPont;
VC-20: Viton® Curative 20 obtained from DuPont;
Carbon Black (CB): Thermax™ Floform N990 medium thermal carbon black obtained from Cancarb Ltd. (Canada);
Wollastonite: surface-treated wollastonite filler obtained from Quarzwerke GmbH (Germany) under the trade name Tremin 238 600EST;
MgO: Megnesium oxide obtained from Kyowa Chemical Industry Co., Ltd. (Japan) under the trade name Kyowa Mag 150;
Ca(OH)$_2$: Calcium hydroxide obtained from Jingjiang City ChangFeng Trade Co., Ltd. (China);
MIBK: Methyl isobutyl ketone obtained from Sinopharm Chemical Reagent Co, Ltd.;
Silane Coupling Agent (SCA): 3-glycidoxypropyltriethoxysilane obtained from Shin-Etsu Chemical (Japan) under the trade name KBM403;
ECA-1: silicone-based electrically conductive adhesive (with a final Ag concentration of 78 wt %, based on the total solid content) that was prepared as follows: (i) grinding 2.2 g silicone and 3.9 g Ag in a mortar for 2 minutes; and (ii) adding another 3.9 g Ag into the mortar and continuing to grind for 8 minutes to obtain ECA-1;
ECA-2: fluoroelastomer-based electrically conductive adhesive (with a final Ag concentration of 78 wt %, based on the total solid content) that was prepared as follows: (i) compounding 119 g FE-2, 7.1 g VC-30, 2.4 g VC -20, 71.5 g Wollastonite in a two roll mill at room temperature for 20 minutes and dissolving 2 grams of the above as-made mixture in 5 g MIBK to form a first solution; (ii) compounding 155 g FE-2, 37 g MgO, and 7.8 g Ca(OH)$_2$ in a two roll mill at room temperature for 20 minutes and dissolving 2 grams of the above as-made mixture in 5 g MIBK to form a second solution; (iii) mixing 7.4 g Ag in the second solution from step (ii) and grinding the mixture in a mortar for 2 minutes; (iv) adding 7.4 Ag into the mixture and grinding in the mortar for another 3 minutes; (v) adding 0.2 g SCA and the first solution from step (i) into the mixture and grinding in the mortar for 5 minutes to obtain the electrically conductive adhesive;

ECA-3: fluoroelastomer-based electrically conductive adhesive (with a final Ag concentration of 78 wt %, based on the total solid content) that was prepared similarly to the methods used in ECA-2, with the exception that (a) in the first solution, the 119 g FE-2 was replaced by 153 g FE-1 and the 71.5 g Wollastonite was replaced by 34.6 g CB, and (b) in the second solution, the 155 g FE-2 was replaced by 155 g FE-1;

ECA-4: fluoroelastomer-based electrically conductive adhesive (with a final Ag concentration of 78 wt %, based on the total solid content) that was prepared similarly to the methods used in ECA-2, with the exception that, in the first solution, the 119 g FE-2 was replaced by 131 g FE-2 and the 71.5 g Wollastonite was replaced by 58.6 g CB;

ECA-5: fluoroelastomer-based electrically conductive adhesive (with a final Ag concentration of 78 wt %, based on the total solid content) that was prepared similarly to the methods used in ECA-2, with the exception that (a) in the first solution, the 119 g FE-2 was replaced by 72.4 g FE-1 and 72.4 g FE-2 and the 71.5 g Wollastonite was replaced by 43.5 g Wollastonite;

ECA-6: fluoroelastomer-based electrically conductive adhesive (with a final Ag concentration of 78 wt %, based on the total solid content) that was prepared similarly to the methods used in ECA-2, with the exception that (a) in the first solution, the 119 g FE-2 was replaced by 185 g FE-1 and the 71.5 g Wollastonite was omitted; and (b) in the second solution, the 155 g FE-2 was replaced by 155 g FE-1;

ECA-7: fluoroelastomer-based electrically conductive adhesive (with a final Ag concentration of 78 wt %, based on the total solid content) that was prepared similarly to the methods used in ECA-2, with the exception that (a) in the first solution, the 119 g FE-2 was replaced by 185 g FE-3 and the 71.5 g Wollastonite was omitted; and (b) in the second solution, the 155 g FE-2 was replaced by 155 g FE-3;

ECA-8: fluoroelastomer-based electrically conductive adhesive (with a final Ag concentration of 78 wt %, based on the total solid content) that was prepared as follows: (i) compounding 90 g FE-4, 10 g E/MA, 2 g Peroxide, 1.5 g TAIC, 0.1 g Antioxidant-1, 0.1 g Antioxidant-2, and 3 g ZnO in a two roll mill at room temperature for 20 minutes and dissolving 2.2 grams of the above as-made mixture in 3.3 g MIBK to form a solution; (ii) mixing 7.8 g Ag in the solution from step (i) using a mixer (manufactured by Thinky USA Inc. (U.S.A.) with the model name ARE-310) at 2000 rpm for 2 mins to obtain the electrically conductive adhesive, in which the weight ratio of FE-4:E/MA was 9:1;

ECA-9: fluoroelastomer-based electrically conductive adhesive (with a final Ag concentration of 78 wt %, based on the total solid content) that was prepared same as ECA-8, except that 90 g FE-4 was replaced by 80 g FE-4 and 10 g E/MA was replaced by 20 g EMA and the weight ratio of FE -4:E/MA in the final electrically conductive adhesive was 4:1;

ECA-10: fluoroelastomer-based electrically conductive adhesive (with a final Ag concentration of 78 wt % of the solid content) that was prepared the same as ECA-8, except that 90 g FE-4 was replaced by 70 g FE-4 and 10 g EMA was replaced by 30 g E/MA and the weight ratio of FE-4:E/MA in the final electrically conductive adhesive was 7:3;

c-Si Cell (c-Si): monocrystalline solar cell obtained from Motech (Suzhou) Renewable Energy Co., Ltd. (China) under the trade name XS125-165R 5", which had a dimension of 125×125 mm (±0.5 mm) and included a pair of 1.6 mm wide silver bus bars and a pair of 2.8 mm wide silver/aluminum continuous soldering pads;

EVA Sheet (EVA): Revax™ 767 ethylene vinyl acetate (EVA) sheet (500 μm thick) obtained from Wenzhou RuiYang Photovoltaic Material Co. Ltd. (China);

Glass Sheet (GS): 3.2 mm thick tempered glass purchased from Dongguan CSG Solar Glass Co., Ltd. (China);

TPT Backsheet (TPT): Akasol™ PTL 3HR 1000V backsheet for photovoltaic modules obtained from Krempel Group (Germany);

Comparative Example CE1 and Examples E1-E6

In CE1, a one-cell module was prepared as follows: (i) casting ECA-1 over Cu strips (2 mm wide and 105 μm thick); (ii) attaching two ECA-coated Cu strips with each of the two bus bars on the front side of the c-Si cell and two ECA-coated Cu strips with each of the two soldering pads on the back side of the c-Si cell; (iii) connecting the two front side ECA-coated Cu strips with a first Sn/Pd-coated Cu ribbon by soldering and connecting the two back side ECA-coated Cu strips with a second Sn/Pd-coated Cu ribbon by soldering; (iv) placing the c-Si cell between two layers of EVA and then a layer of GS to the front side and a layer of TPT to the back side of the c-Si cell; (v) laminating the assembly using a Meier ICOLAM™ 10/08 laminator (Meier Vakuumtechnik GmbH (Germany)) at a pressure of 1 atm and a temperature of 145° C. for 15 minutes to form the final one-cell module, in which each of first and second Sn/Pd-coated Cu ribbons having one end extending out of the module.

In E1, a one-cell module was prepared as follow: (i) providing four (4) Cu strips (2 mm wide and 105 μm thick); (ii) casting ECA-2 over one side of the Cu strips followed by drying in air for 1 hour and then at 115° C. for 10 minutes; (iii) casting ECA-2 over the two bus bars on the front side of the c-Si cell followed by drying in air for 1 hour and then at 115° C. for 10 minutes, and casting ECA-2 over the two soldering pads on the back side of the c-Si cell followed by drying in air for 1 hour and then at 115° C. for 10 minutes; (iv) aligning two ECA-coated Cu strips over each of the two bus bars with the ECA-2 coating layer of the Cu strips in contact with the ECA-2 coating layer of the two bus bars and aligning the other two ECA-coated Cu strips over each of the two soldering pads with the ECA-2 coating layer of the Cu strips in contact with the ECA-2 coating layer of the two soldering pads; (v) connecting the two front side Cu strips with a first Sn/Pd-coated Cu ribbon by soldering and connecting the two back side Cu strips with a second Sn/Pd-coated Cu ribbon by soldering; (vi) placing the c-Si cell between two layers of EVA and then a layer of GS to the front side and a layer of TPT to the back side of the c-Si cell; (vii) laminating the assembly using a Meier ICOLAM™

10/08 laminator (Meier Vakuumtechnik GmbH (Germany)) at a pressure of 1 atm and a temperature of 145° C. for 15 minutes to form the final one-cell module, in which each of first and second Sn/Pd-coated Cu ribbons having one end extending out of the module.

In E2, a one-cell module was prepared the same way as described in E1, with the exception that ECA-3 was used in place of ECA-2.

In E3, a one-cell module was prepared the same way as described in E1, with the exception that ECA-4 was used in place of ECA-2.

In E4, a one-cell module was prepared the same way as described in E1, with the exception that ECA-5 was used in place of ECA-2.

In E5, a one-cell module was prepared the same way as described in E1, with the exception that ECA-6 was used in place of ECA-2.

In E6, a one-cell module was prepared the same way as described in E1, with the exception that ECA-7 was used in place of ECA-2.

In E7, a one-cell module was prepared the same way as described in E1, with the exception that ECA-8 was used in place of ECA-2.

For each of the modules prepared in CE1 and E1-E7, the power output of the module as prepared ($P_{Initial}$) and the power output of the module post 50, 100, 150, and 200 cycles of thermal cycling tests ($P_{TC}$) were measured using Spi-Sun Simulator™ 3500SLP (Spire Corporation (U.S.A.). The power loss ($P_{Loss}$) post various cycles of thermal cycles was calculated as follows and tabulated in Table 1:

$$P_{Loss}=(P_{TC}-P_{Initial})/P_{Initial}$$

During thermal cycling tests were conducted using a ETCU 110 Solar Panel Environmental Test Chamber (manufactured by Thermal Product Solutions (U.S.A.)) and in each cycle, the temperature of the chamber was first set at 25° C., decreased to −40° C. at a rate of 1° C./min, stabilized at −40° C. for 55 minutes, increased to 85° C. at a rate of 1° C./min, stabilized at 85° C. for 55 minutes, and then decreased back to 25° C. at a rate of 1° C./min.

As demonstrated by the examples, when silicone-based electrically conductive adhesive was used (CE1), the efficiency of solar cell modules could be decreased by up to 7% after 200 cycles of thermal cycling test. However, when fluoroelastomer-based electrically conductive adhesive is used, the decrease in module efficiency was maintained within 1% after thermal cycling test.

TABLE 1

| | CE1 | E1 | E2 | E3 | E4 | E5 | E6 | E7 |
|---|---|---|---|---|---|---|---|---|
| Electrically Conductive Adhesive Type | | | | | | | | |
| | Silicone-based | FE-based | FE-based | FE-based | FE-based | FE-based | FE-based | FE-based |
| Power Loss | | | | | | | | |
| 50× TC (%) | −2.9 | −0.4 | 0.2 | 0.1 | −0.2 | −0.2 | 0.1 | −0.7 |
| 100× TC (%) | −3.5 | −0.6 | −0.8 | −0.9 | −0.9 | −1 | 0 | −0.5 |
| 150× TC (%) | −4.1 | 0 | −1.1 | −1 | −1.2 | −1.5 | −0.1 | −1.4 |
| 200× TC (%) | −7 | −0.3 | −0.8 | −1 | −1 | −1 | −0.1 | −0.53 |

Example E8

In E8, a one-cell module was prepared as follows: (i) preparing electrically conductive adhesive (ECA) strips (2 mm wide and 50 μm thick) by casting ECA-6 over a release film (i.e., a 188 μm thick PET film) followed by drying at 115° C. for 10 min and cutting; (ii) covering the two bus bars on the front side of a c-Si cell and the two soldering pads on the back side of the c-Si cell with the ECA strips on a hot plate set at 145° C. for 5 seconds; (iii) removing release films from ECA strips and aligning Cu strips (2 mm wide) over each of the ECA strips; (iv) connecting the two front side Cu strips with a first Sn/Pd-coated Cu ribbon by soldering and connecting the two back side Cu strips with a second Sn/Pd-coated Cu ribbon by soldering; (vi) placing the c-Si cell between two layers of EVA and then a layer of GS to the front side and a layer of TPT to the back side of the c-Si cell; (vii) laminating the assembly using a Meier ICOLAM™ 10/08 laminator (Meier Vakuumtechnik GmbH (Germany)) at a pressure of 1 atm and a temperature of 145° C. for 15 minutes to form the final one-cell module, in which each of first and second Sn/Pd-coated Cu ribbons having one end extending out of the module.

Examples E9-E12

In each of E9-E12, electrically conductive adhesives (ECA-2, ECA-8, ECA-9, or ECA-10, see Table 2 below) was casted over one side of a Cu foil followed by drying in air for 1 hour and then at 115° C. for 10 minutes. The final thickness of the ECA coating was measured to be around 50 μm. The coated Cu foil was then cut into 1.5 mm wide strips leaving one end of the strips (about 5 cm long) free of the ECA coating. The coated Cu strips were laminated over the front bus bars of c-Si cells by vacuum lamination at 1 atm and 145° C. for 15 minutes with the ECA coating bonded to the bus bars. Using a peeling station (model Number: ST-RX N002; manufactured by MOGRL Technology Co., Ltd. (Taiwan) (台湾昇群科技 股份有限公司)) and at a peeling speed of about 300 mm/min, the 180° peeling strength between the Cu strips and the bus bars were measured. Results are tabulated in Table 2 below.

As demonstrated herein, with the addition of E/MA into the FE-based ECA, it could provide much more improved bonding strength between the Cu strips and the bus bars.

TABLE 2

| | E9 | E10 | E11 | E12 |
|---|---|---|---|---|
| Weight ration of FE:E/MA in EGA | | | | |
| FE:E/MA (by weight) | 10:0 | 9:1 | 8:2 | 7:3 |
| Peeling Strength between Cu Strips and Bus Bars | | | | |
| Peeling Strength (N/cm) | 2.3 | 6.8 | 11.2 | 9.9 |

What is claimed is:

1. A solar cell module comprising at least one solar cell and at least one wiring member, wherein,
   (i) the at least one solar cell has at least one surface electrode and the at least one wiring member is connected to the at least one surface electrode via an electrically conductive adhesive;
   (ii) the electrically conductive adhesive is formed of an adhesive composition comprising an elastomer matrix and 40-90 wt % of electrically conductive particles dispersed in the elastomer matrix, with the wt % of all components comprised in the adhesive composition totaling to 100 wt %; and
   (iii) the elastomer matrix comprises at least one fluoroelastomer;

wherein the elastomer matrix comprises at least one vinylidene fluoride-containing fluoroelastomer that is cross-linked with a cross-linking agent; and wherein the cross-linking agent is selected from the group consisting of bisphenol compounds, diamino compounds, aminophenol compounds, amino-siloxane compounds, amino-silanes, phenol-silanes, peroxides, and combinations of two or more thereof.

2. The solar cell module of claim 1, wherein the at least one vinylidene fluoride-containing fluoroelastomer is vinylidene fluoride/hexafluoropropylene copolymer.

3. The solar cell module of claim 1, wherein the elastomer matrix consists essentially of the at least one fluoroelastomer.

4. The solar cell module of claim 1, wherein the elastomer matrix comprises the at least one fluoroelastomer and at least one ethylene/alkyl (meth)acrylate copolymer elastomer, with the at least one fluoroelastomer present at a level of 65 wt % or more, based on the total weight of the elastomer matrix.

5. The solar cell module of claim 4, wherein the at least one ethylene/alkyl (meth)acrylate copolymer elastomer comprises polymerized units of ethylene and 40-90 wt % of polymerized units of at least one alkyl (meth)acrylate, based on the total weight of the ethylene/alkyl (meth)acrylate copolymer elastomer.

6. The solar cell module of claim 4, wherein the at least one ethylene/alkyl (meth)acrylate copolymer elastomer is selected form the group consisting of ethylene/methyl (meth)acrylate copolymers, ethylene/ethyl (meth)acrylate copolymers, ethylene/butyl (meth)acrylate copolymers.

7. The solar cell module of claim 1, wherein the electrically conductive particles are selected from metal particles and non-metal particles.

8. The solar cell module of claim 7, wherein the electrically conductive particles are metal particles selected from the group consisting of particles of Au, Ag, Ni, Cu, Al, Sn, Zn, Ti, Sn, Bi, W, Pb, and alloys of two or more thereof.

9. The solar cell module of claim 1, wherein 40-85 wt % of the electrically conductive particles are dispersed in the elastomer matrix, based on the total weight of the adhesive composition.

10. The solar cell module of claim 1, wherein the at least one solar cell has a front surface electrode and a back surface electrode, and wherein there are one or more front wiring members connected to the front surface electrode via the electrically conductive adhesive and one or more back wiring members connected to the back surface electrode via the electrically conductive adhesive.

11. The solar cell module of claim 10, wherein the at least one solar cell is a wafer-based solar cell.

12. The solar cell module of claim 10, wherein the at least one solar cell is a thin film solar cell.

13. The solar cell module of claim 1, wherein the electrically conductive particles are selected from metal particles and non-metal particles.

14. The solar cell module of claim 1, wherein 40-85 wt % of the electrically conductive particles are dispersed in the elastomer matrix, based on the total weight of the adhesive composition.

15. The solar cell module of claim 1, wherein the at least one solar cell has a front surface electrode and a back surface electrode, and wherein there are one or more front wiring members connected to the front surface electrode via the electrically conductive adhesive and one or more back wiring members connected to the back surface electrode via the electrically conductive adhesive.

16. The solar cell module of claim 4, wherein the electrically conductive particles are selected from metal particles and non-metal particles.

17. The solar cell module of claim 4, wherein 40-85 wt % of the electrically conductive particles are dispersed in the elastomer matrix, based on the total weight of the adhesive composition.

18. The solar cell module of claim 4, wherein the at least one solar cell has a front surface electrode and a back surface electrode, and wherein there are one or more front wiring members connected to the front surface electrode via the electrically conductive adhesive and one or more back wiring members connected to the back surface electrode via the electrically conductive adhesive.

* * * * *